United States Patent
He et al.

(10) Patent No.: US 11,441,795 B2
(45) Date of Patent: Sep. 13, 2022

(54) ELECTRIC CONTROL BOX FOR AIR CONDITIONER AND AIR CONDITIONER WITH SAME

(71) Applicants: GD MIDEA HEATING & VENTILATING EQUIPMENT CO., LTD., Foshan (CN); MIDEA GROUP CO., LTD., Foshan (CN)

(72) Inventors: Junfei He, Foshan (CN); Shilin Qiu, Foshan (CN)

(73) Assignees: GD MIDEA HEATING & VENTILATING EQUIPMENT CO., LTD., Guangdong (CN); MIDEA GROUP CO.. LTD., Guangdong (CN)

( * ) Notice: Subject to any disclaimer, the term of this patent is extended or adjusted under 35 U.S.C. 154(b) by 256 days.

(21) Appl. No.: 16/475,519

(22) PCT Filed: Dec. 5, 2017

(86) PCT No.: PCT/CN2017/114576
§ 371 (c)(1),
(2) Date: Jul. 2, 2019

(87) PCT Pub. No.: WO2018/205576
PCT Pub. Date: Nov. 15, 2018

(65) Prior Publication Data
US 2019/0346159 A1    Nov. 14, 2019

(30) Foreign Application Priority Data

May 8, 2017   (CN) .......................... 201720506633.9
May 8, 2017   (CN) .......................... 201720506635.8

(51) Int. Cl.
F24F 1/24   (2011.01)
H05K 5/06   (2006.01)
F24F 13/22  (2006.01)

(52) U.S. Cl.
CPC .............. *F24F 1/24* (2013.01); *F24F 13/222* (2013.01); *H05K 5/069* (2013.01)

(58) Field of Classification Search
CPC ... H02B 1/28; H05K 5/069; F24F 1/24; F24F 1/36; F24F 1/38; F24F 13/222
See application file for complete search history.

(56) References Cited

U.S. PATENT DOCUMENTS 6,701,738 B2 *   3/2004   Kobayashi ............... F24F 1/027
                                            454/201
7,177,148 B2 *   2/2007   Nakata ..................... H02B 1/28
                                            174/16.1
(Continued)

FOREIGN PATENT DOCUMENTS

CN     203454294 A   2/2014
CN     104613557 A   5/2015
(Continued)

OTHER PUBLICATIONS

International Search Report and Written Opinion dated Mar. 2, 2018.

*Primary Examiner* — Paul Alvare
(74) *Attorney, Agent, or Firm* — Dilworth & Barrese, LLP.; Michael J. Musella, Esq.

(57) ABSTRACT

An electric control box (100) for an air conditioner and an air conditioner with the same are provided. The electric control box includes a housing (1); a cooling fin (2) running through the housing (1) and having a part located inside the housing (1) and another part located outside the housing (1); an inner water-guiding part (3) located inside the housing (1) and below the cooling fin (2); an outer water-guiding part (4) located outside the housing (1) and below the inner water-guiding part (3), the inner water-guiding part (3) and the
(Continued)

outer water-guiding part (4) defining a water guide passage (a) configured to guide water (b) inside the housing (1) to the outside of the housing (1).

18 Claims, 7 Drawing Sheets

(56) References Cited

U.S. PATENT DOCUMENTS

| | | | | |
|---|---|---|---|---|
| 7,944,697 | B2* | 5/2011 | Hata | H05K 5/0213 |
| | | | | 174/547 |
| 8,959,942 | B2* | 2/2015 | Mochizuki | F24F 13/20 |
| | | | | 62/285 |
| 8,978,393 | B2* | 3/2015 | Hika | F24F 1/22 |
| | | | | 62/77 |
| 2008/0101041 | A1* | 5/2008 | Chang | H05K 5/0213 |
| | | | | 361/728 |
| 2017/0130975 | A1* | 5/2017 | Shoemaker | F24F 1/50 |
| 2020/0386439 | A1* | 12/2020 | Uzawa | F24F 13/20 |

FOREIGN PATENT DOCUMENTS

| | | | | |
|---|---|---|---|---|
| CN | 205783589 A | | 12/2016 | |
| EP | 2525158 A2 * | | 11/2012 | F24F 1/22 |
| JP | 2007127379 A | | 5/2007 | |
| JP | 2013137159 A | | 7/2013 | |
| JP | 2016191504 A | | 11/2016 | |

* cited by examiner

ELECTRIC CONTROL BOX FOR AIR CONDITIONER AND AIR CONDITIONER WITH SAME

The present disclosure claims priority of Chinese Patent Application No. 201720506633.9, filed on May 8, 2017 and Chinese Patent Application No. 201720506635.8, filed on May 8, 2017, the entire disclosure of each of which is hereby incorporated by reference as a part of the present disclosure. No new matter is added.

FIELD

The present disclosure relates to a field of refrigeration, and more particularly to an electric control box for an air conditioner and an air conditioner with same.

BACKGROUND

In the related art, a rubber seal ring or sponge seal ring is usually provided at an abutting surface between cooling fins and an electric control box when the cooling fins are mounted to the electric control box, and a sealant is also applied around the seal ring to seal the cooling fins in a waterproof manner. Consequently, water may easily infiltrate the electric control box, and the production and installation of the electric control box involves a lot of processes, which affects the production efficiency of the electric control box.

SUMMARY

The present disclosure seeks to solve at least one of the problems existing in the related art to at least some extent. The present disclosure provides an electric control box for an air conditioner, and the waterproof effect at cooling fins is satisfactory, thereby improving the reliability and production efficiency of the electric control box.

The present disclosure further provides an air conditioner with the above electric control box. The electric control box for an air conditioner includes a housing; a cooling fin running through the housing and having a part located inside the housing and another part located outside the housing; an inner water-guiding part located inside the housing and below the cooling fin; an outer water-guiding part located outside the housing and below the inner water-guiding part, the inner water-guiding part and the outer water-guiding part defining a water guide passage configured to guide water inside the housing to the outside of the housing.

In the electric control box for an air conditioner according to embodiments of the present disclosure, the inner water-guiding part and the outer water-guiding part are provided to define the water guide passage to guide the water inside the housing to the outside, such that the waterproof effect at the cooling fin is satisfactory, thereby improving the reliability of the electric control box. Compared with the related art, seal rings and sealants are omitted, such that the electric control box has a simple structure, and materials and installation processes are reduced during production of the electric control box, which further improves the production efficiency of the electric control box.

According to some embodiments of the present disclosure, the housing defines an opening, the inner water-guiding part and the outer water-guiding part are located at the opening, and an upper edge defining the opening is bent towards the outside of the housing to form a water guide plate.

Furthermore, the water guide plate is configured as an arc plate.

Furthermore, the arc plate protrudes towards the cooling fin.

According to some embodiments of the present disclosure, the inner water-guiding part and the outer water-guiding part are integrally formed.

According to some embodiments of the present disclosure, at least one of the inner water-guiding part and the outer water-guiding part is welded to the housing.

According to some embodiments of the present disclosure, the housing defines an opening, and a lower edge defining the opening is bent towards the inside of the housing to form the inner water-guiding part.

Furthermore, the inner water-guiding part is configured as an arc plate.

Furthermore, the arc plate protrudes towards a direction way from the cooling fin.

Furthermore, the electric control box further includes a water shield, the water shield is located outside the housing and covers the opening and the outer water-guiding part, and the water shield defines a through hole in a lower part thereof.

In some embodiments of the present disclosure, the outer water-guiding part has a lower end inclining towards a direction away from the housing, in a direction away from the cooling fin.

In some embodiments of the present disclosure, a perpendicular distance between an end of the inner water-guiding part adjacent to the cooling fin and a corresponding position on the housing is L1, and a portion of the cooling fin adjacent to the inner water-guiding part extends into the housing by a length L2, in which L1≥L2.

In some embodiments of the present disclosure, the cooling fin is connected to the housing by means a threaded fastener.

In some embodiments of the present disclosure, the electric control box further includes a water shield, the water shield is located outside the housing and covers a portion of the water guide passage outside the housing, and a gap is defined between a lower part of the water shield and an outer surface of the housing.

The air conditioner according to embodiments of the present disclosure includes the above electric control box.

The air conditioner according to embodiments of the present disclosure is provided with the electric control box according to the above embodiments of the present disclosure, such that the waterproof effect at the cooling fin is satisfactory, thereby improving the reliability of the air conditioner. Compared with the related art, seal rings and sealants are omitted, such that the electric control box has a simple structure, and materials and installation processes are reduced during production of the electric control box, which further improves the production efficiency of the air conditioner.

REFERENCE NUMERALS

Figure 1:
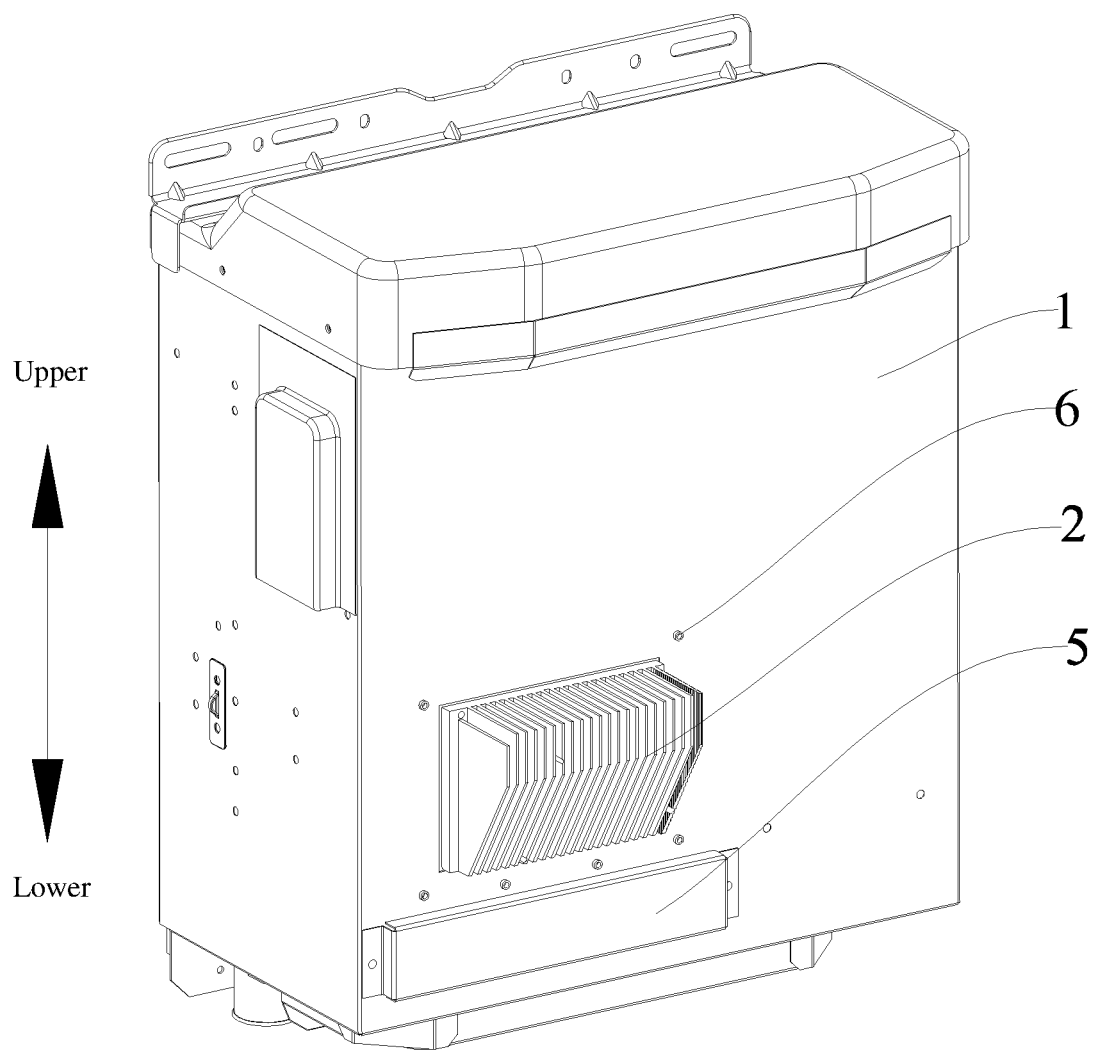
FIG. 1 is a schematic view of an electric control box according to embodiments of the present disclosure.
Figure 2:
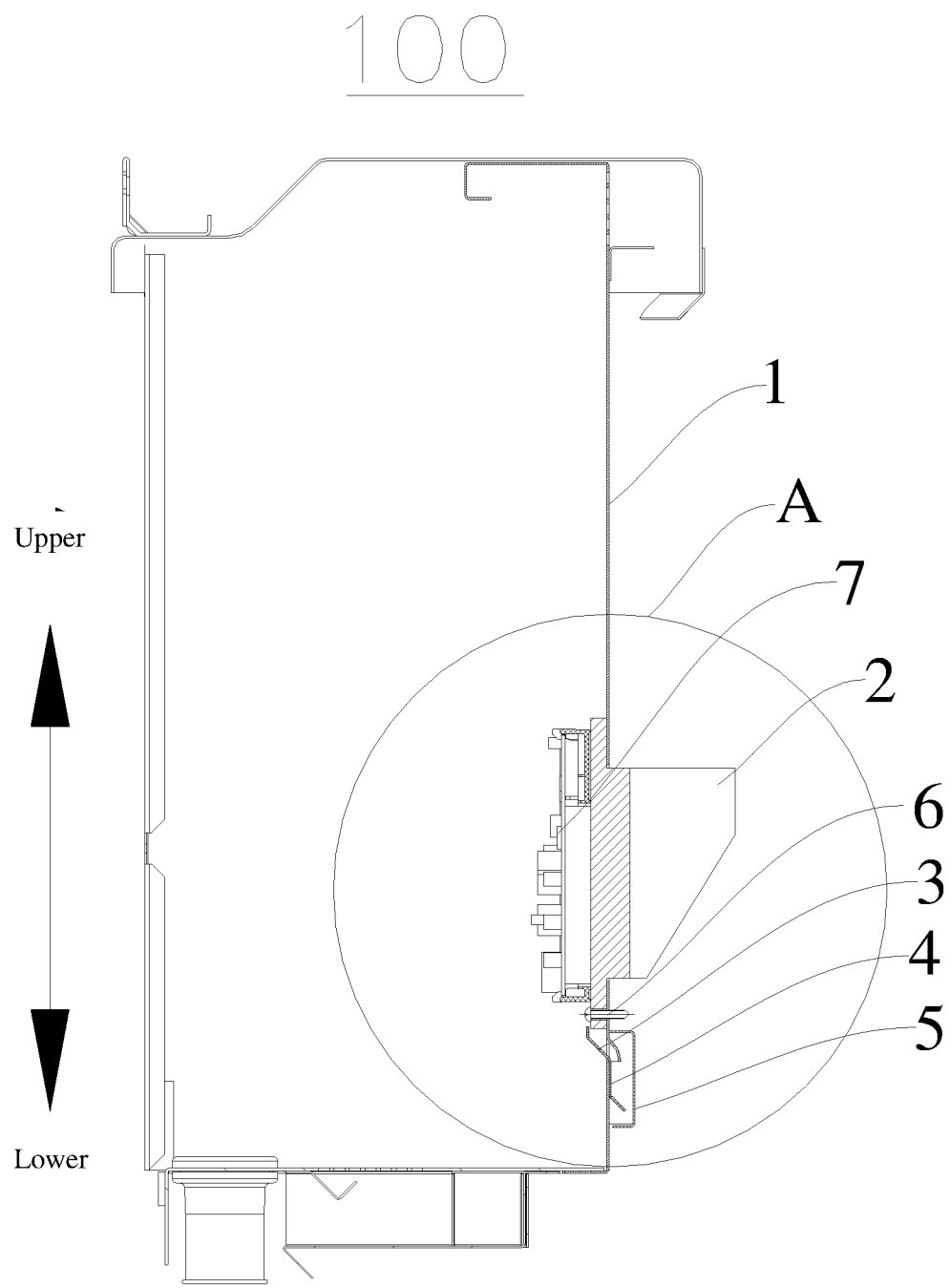
FIG. 2 is a sectional view of an electric control box according to some embodiments of the present disclosure.
Figure 3:
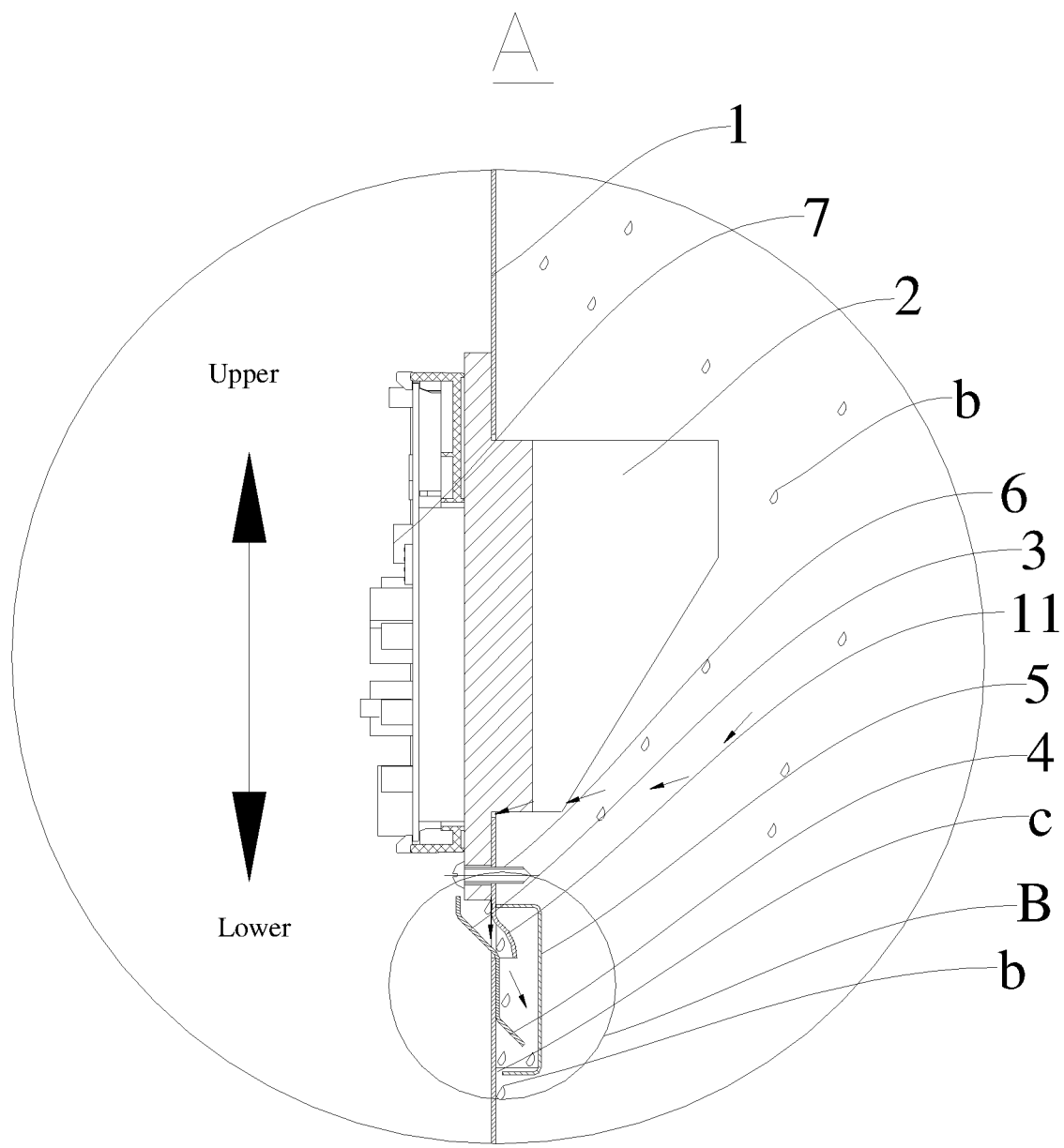
FIG. 3 is an enlarged view of part A in FIG. 2.

Electric control box 100;
Housing 1; water guide plate 11; opening 12; cooling fin 2; inner water-guiding part 3; outer water-guiding part 4; water shield 5; threaded fastener 6; circuit board 7; water guide passage a; water b; gap c.

DETAILED DESCRIPTION

Embodiments of the present disclosure are described in detail hereafter, and examples of the embodiments are shown in the drawings. The embodiments described herein with reference to drawings are explanatory, and used to illustrate the present disclosure but not be construed to limit the present disclosure.

In the description of the present disclosure, it should be understood that, terms such as "length," "upper," "lower," "bottom," "inner," and "outer" as well as derivative thereof should be construed to refer to the orientation or positional relationships as then described or as shown in the drawings. These relative terms are for convenience of description and do not indicate or imply that the device or element has specific orientations, is constructed or operated in a particular orientation. Accordingly, the terms should not be construed as limiting the scope of the invention.

In the description of the present disclosure, it should be understood that, unless specified or limited otherwise, the terms "mounted," "connected," and "coupled" and variations thereof are used broadly and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

An electric control box 100 for an air conditioner according to embodiments of the present disclosure will be described below with reference to FIG. 1 to FIG. 8.

As shown in FIG. 1 to FIG. 8, the electric control box 100 according to embodiments of the present disclosure includes a housing 1, a cooling fin 2, an inner water-guiding part 3 and an outer water-guiding part 4.

Specifically, the cooling fin 2 runs through the housing 1, a part of the cooling fin 2 is located inside the housing 1, and another part of the cooling fin 2 is located outside the housing 1. The inner water-guiding part 3 is located inside the housing 1 and below the cooling fin 2. The outer water-guiding part 4 is located outside the housing 1 and below the inner water-guiding part 3. The inner water-guiding part 3 and the outer water-guiding part 4 define a water guide passage a to guide water b inside the housing 1 to the outside of the housing 1.

It is known that, the water b easily infiltrates the housing 1 through an abutting surface between the cooling fin 2 and the housing 1 due to the arrangement of the cooling fin 2 and the housing 1, which affects normal operation of the electric control box 100. In the electric control box 100 according to embodiments of the present disclosure, when the water b infiltrates the housing 1 through the abutting surface between the cooling fin 2 and the housing 1, the water b drops naturally under the action of gravity, and the inner water-guiding part 3 below the cooling fin 2 can receive the water b which drops along the cooling fin 2 in the electric control box 100. Meanwhile, the water guide passage a defined by the outer water-guiding part 4 and the inner water-guiding part 3 can guide the water b received by the inner water-guiding part 3 to the outside the housing 1, such that the waterproof effect at the cooling fin 2 is satisfactory, thereby improving the reliability of the electric control box 100. Compared with the related art, the electric control box 100 according to the embodiments of the present disclosure is free of seal rings and sealants, such that the electric control box 100 has a simple structure, and materials and installation processes are reduced during production of the electric control box 100, which further improves the production efficiency of the electric control box 100 (one-way arrows in FIG. 3, FIG. 4, FIG. 7 and FIG. 8 indicate a flow direction of the water b infiltrating the housing 1 through the abutting surface between the cooling fin 2 and the housing 1).

In the electric control box 100 according to the embodiments of the present disclosure, the inner water-guiding part 3 and the outer water-guiding part 4 are provided to define the water guide passage a configured to guide the water b inside the housing 1 to the outside, such that the waterproof effect at the cooling fin 2 is satisfactory, thereby improving the reliability of the electric control box 100. Compared with the related art, seal rings and sealants are omitted, such that the electric control box 100 has a simple structure, and materials and installation processes are reduced during production of the electric control box 100, which further improves the production efficiency of the electric control box 100.

According to some embodiments of the present disclosure, the housing 1 defines an opening 12, and the inner water-guiding part 3 and the outer water-guiding part 4 are located at the opening 12. An upper edge defining the opening 12 is bent towards the outside of the housing 1 to form a water guide plate 11. Therefore, the water b received by the inner water-guiding part 3 flows along the water guide passage a and flows out of the housing 1 through the opening 12. Meanwhile, with the arrangement of the water guide plate 11, the water b outside the housing 1 can be to some extent prevented from entering the housing 1 through the opening 12 and hence from affecting the reliability of the electric control box 100, and the water b outside the housing 1 can be guided to flow downwards to some extent.

Optionally, the water guide plate 11 is configured as an arc plate, such that a flow guide function of the water guide plate 11 can be improved.

Specifically, the arc plate protrudes towards the cooling fin 2, such that the flow guide function of the water guide plate 11 can be further improved, and the water b outside the housing 1 can be further prevented from entering the housing 1 through the opening 12 and hence be prevented from affecting the reliability of the electric control box 100.

According to some embodiments of the present disclosure, in a direction away from the cooling fin 2, a lower end of the outer water-guiding part 4 inclines towards a direction away from the housing 1. When the electric control box 100 is in a hostile environment, the lower end of the outer water-guiding part 4 can prevent the water b outside the housing 1 from splashing into the housing 1 through the opening 12 to some extent.

Figure 4:
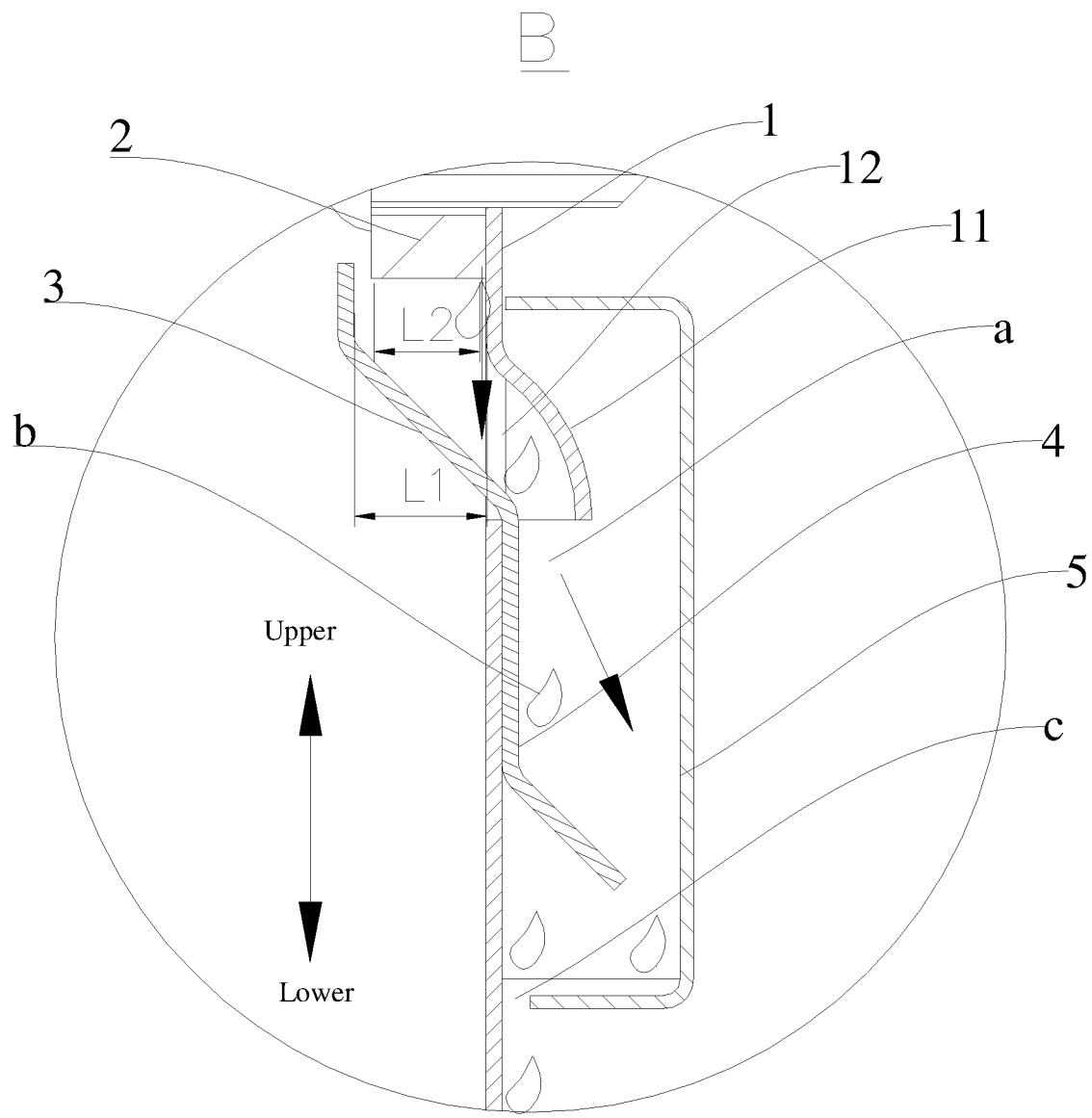
FIG. 4 is an enlarged view of part B in FIG. 3.

As shown in FIG. 4, according to some embodiments of the present disclosure, a perpendicular distance between an end of the inner water-guiding part 3 adjacent to the cooling fin 2 and a corresponding position on the housing 1 is L1, and a portion of the cooling fin 2 adjacent to the inner water-guiding part 3 extends into the housing 1 by a length L2. When L1≥L2, the inner water-guiding part 3 can receive the water b infiltrating the housing 1 through the abutting surface between the cooling fin 2 and the housing 1, and the waterproof effect for the cooling fin 2 can be further improved.

Optionally, the inner water-guiding part 3 and the outer water-guiding part 4 are integrally formed, thereby further reducing the production and installation processes of the electric control box 100. Therefore, the electric control box 100 has a simple structure, and the production efficiency of the electric control box 100 can be improved.

According to some embodiments of the present disclosure, at least one of the inner water-guiding part 3 and the outer water-guiding part 4 is welded to the housing 1. That is, both of the inner water-guiding part 3 and the outer water-guiding part 4 are welded to the housing 1, or one of the inner water-guiding part 3 and the outer water-guiding part 4 is welded to the housing 1. Therefore, connection between the inner water-guiding part 3 and/or the outer water-guiding part 4 and the housing 1 is simple and stable.

Optionally, the inner water-guiding part 3 is connected to the housing 1 via butt welding, such that the connection between the inner water-guiding part 3 and the housing 1 is simple, which helps to reduce the manufacturing cost of the electric control box 100.

Optionally, the outer water-guiding part 4 is connected to the housing 1 via butt welding, such that the connection between the outer water-guiding part 4 and the housing 1 is simple, which helps to reduce the manufacturing cost of the electric control box 100.

According to some embodiments of the present disclosure, the electric control box 100 further includes a water shield 5. The water shield 5 is located outside the housing 1 and covers a portion of the water guide passage a outside the housing 1. A gap c is defined between a lower part of the water shield 5 and an outer surface of the housing 1. Therefore, due to the position of the water shield 5, the water b outside the housing 1 can be to some extent prevented from entering the housing 1 through the opening 12 and hence from affecting the reliability of the electric control box 100, and moreover, the water b outside the housing 1 can be guided to some extent to flow downwards. Meanwhile, with the gap c between the water shield 5 and the housing 1, the water b flowing downwards through the water guide passage a can smoothly flow to the outside of the electric control box 100.

Optionally, as shown in FIG. 1 to FIG. 3 and FIG. 5 to FIG. 6, the cooling fin 2 is connected to the housing 1 by means of a threaded fastener 6. Therefore, the cooling fin 2 is fixed in a simple way and has a reliable structure, which also helps to reduce the manufacturing cost of the electric control box 100.

Furthermore, as shown in FIG. 2 to FIG. 3 and FIG. 5 to FIG. 6, the electric control box 100 further includes a circuit board 7, and the circuit board 7 is fixed to the cooling fin 2 by means of a screw (not shown in the drawings).

According to some embodiments of the present disclosure, the housing 1 defines the opening 12, and a lower edge defining the opening 12 is bent towards the inside of the housing 1 to form the inner water-guiding part 3.

Optionally, the inner water-guiding part 3 is an arc plate, such that the flow guide function of the inner water-guiding part 3 can be improved.

Specifically, the arc plate protrudes away from the cooling fin 2, such that the flow guide function of the inner water-guiding part 3 can be further improved, and the capacity of the inner water-guiding part 3 can have the enhanced ability to receive the water b.

In some embodiments of the present disclosure, in a direction away from the cooling fin 2, a lower end of the outer water-guiding part 4 inclines towards a direction away from the housing 1. Thus, when the electric control box 100 is in the hostile environment, the water b outside the housing 1 can be prevented from splashing into the housing 1 through the opening 12 to some extent by means of the lower end of the outer water-guiding part 4.

Figure 7:
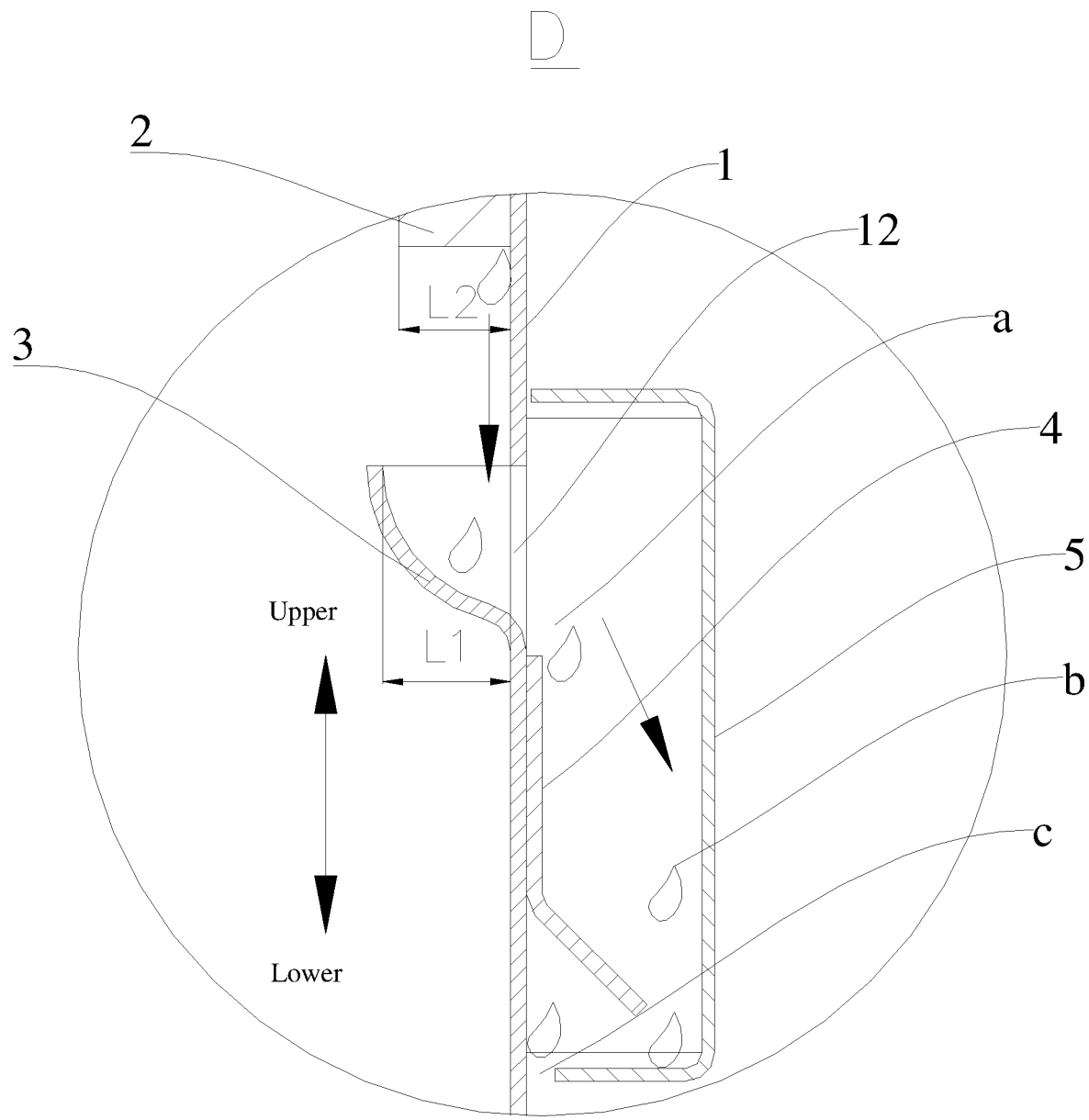
FIG. 7 is an enlarged view of part D in FIG. 6.

As shown in FIG. 7, in some embodiments of the present disclosure, a perpendicular distance between an end of the inner water-guiding part 3 adjacent to the cooling fin 2 and a corresponding position on the housing 1 is L1, and a portion of the cooling fin 2 adjacent to the inner water-guiding part 3 extends into the housing 1 by a length L2. When L1≥L2, the inner water-guiding part 3 can receive the water b infiltrating the housing 1 through the abutting surface between the cooling fin 2 and the housing 1, and the waterproof effect for the cooling fin 2 can be further improved.

Optionally, the outer water-guiding part 4 is welded to the housing 1, such that the connection between the outer water-guiding part 4 and the housing 1 is simple and stable.

Optionally, the outer water-guiding part 4 is connected to the housing 1 via butt welding, such that the connection between the outer water-guiding part 4 and the housing 1 is simple, which helps to reduce the manufacturing cost of the electric control box 100.

Figure 5:
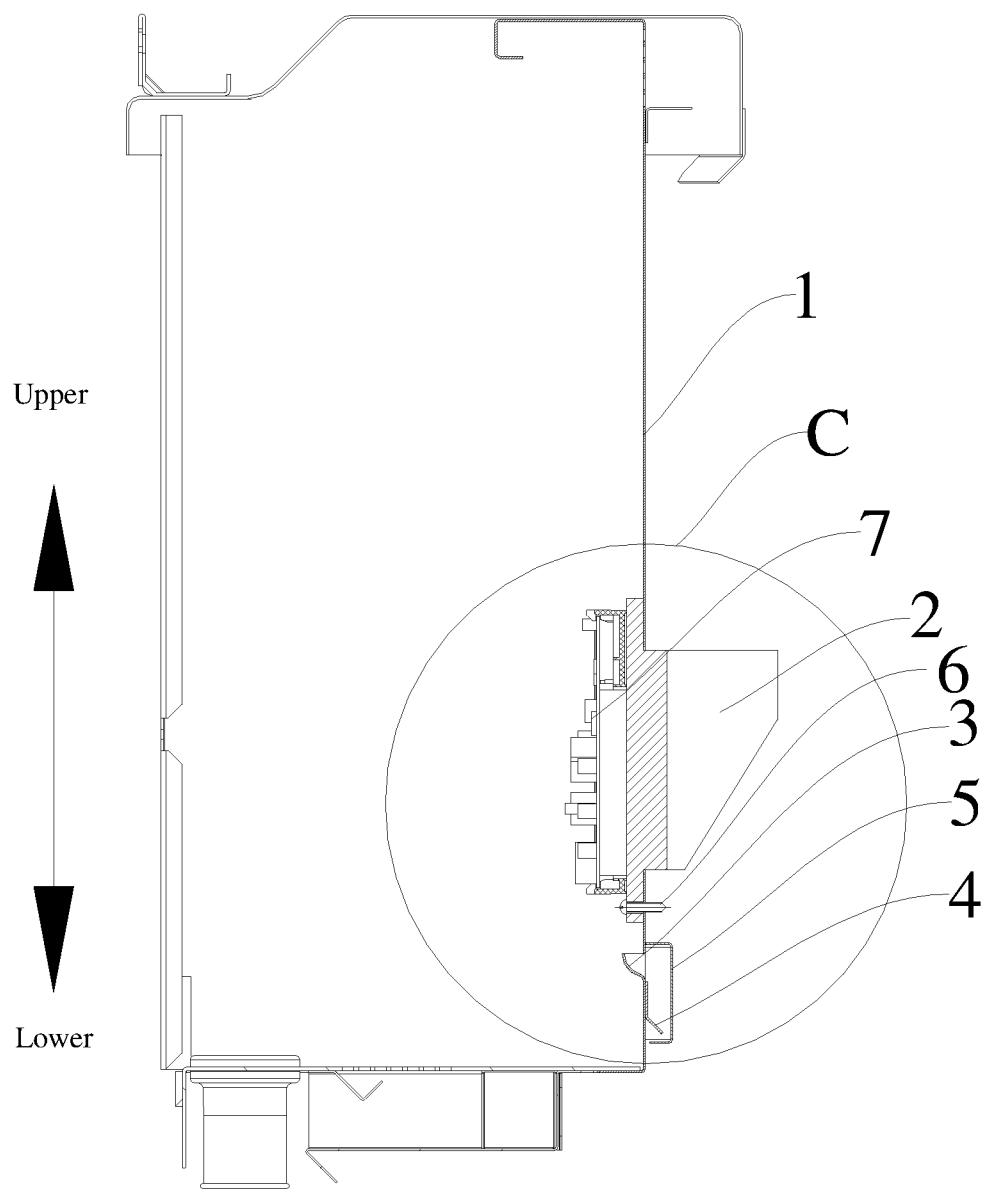
FIG. 5 is a sectional view of an electric control box according to some other embodiments of the present disclosure.
Figure 6:
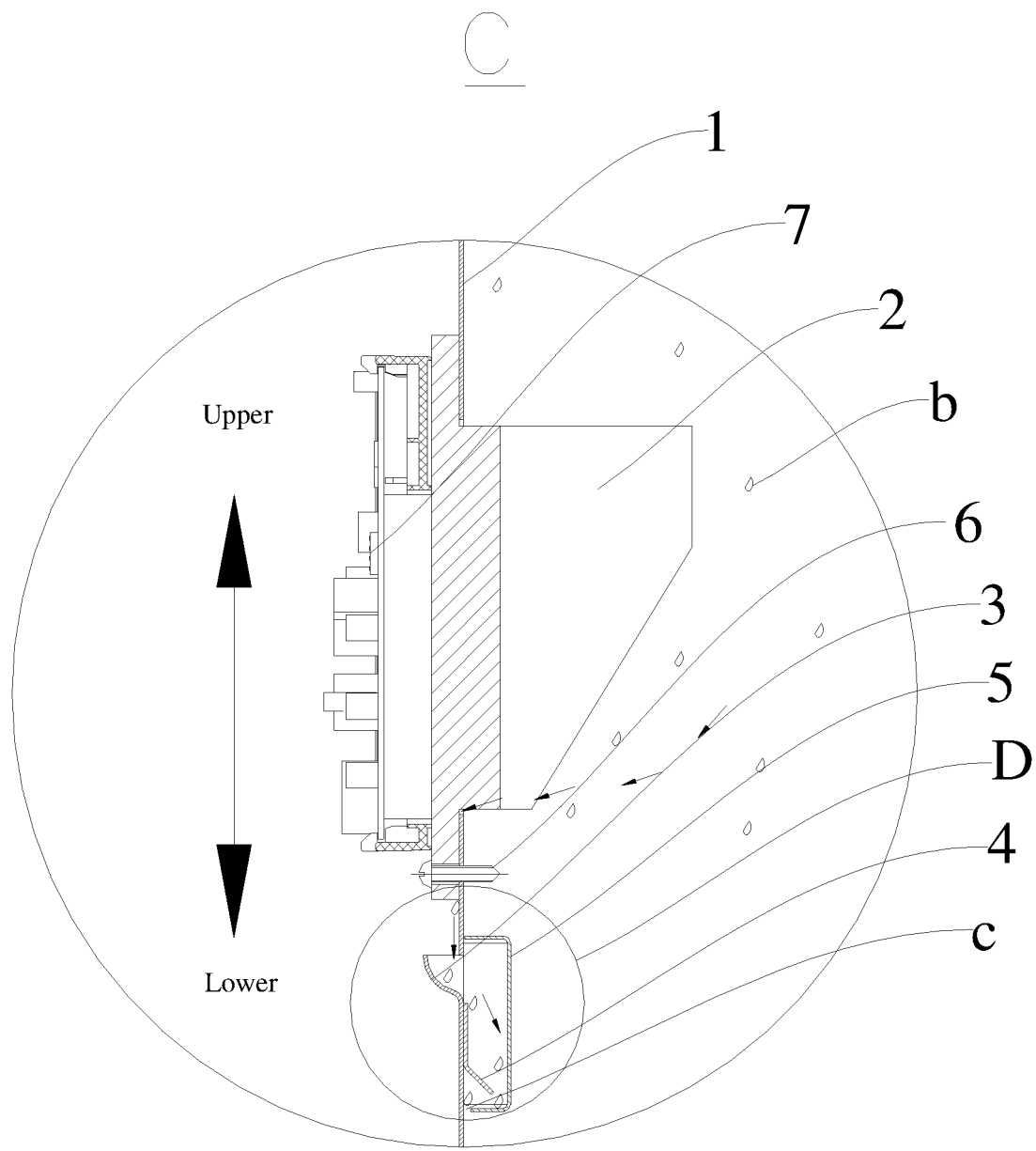
FIG. 6 is an enlarged view of part C in FIG. 5.

Optionally, as shown in FIG. 1, FIG. 5 and FIG. 6, the cooling fin 2 is connected to the housing 1 by means of the threaded fastener 6. Therefore, the cooling fin 2 is fixed in a simple way and has a reliable structure, which also helps to reduce the manufacturing cost of the electric control box 100.

Furthermore, as shown in FIG. 5 and FIG. 6, the electric control box 100 further includes a circuit board 7, and the circuit board 7 is fixed to the cooling fin 2 by means of a screw (not shown in the drawings).

In some embodiments of the present disclosure, the electric control box 100 further includes a water shield 5. The water shield 5 is located outside the housing 1 and covers the opening 12 and the outer water-guiding part 4, and the water shield 5 defines a through hole in a lower part thereof. Therefore, due to the position of the water shield 5, the water b outside the housing 1 can be to some extent prevented from entering the housing 1 through the opening 12 and hence from affecting the reliability of the electric control box 100, and moreover, the water b outside the housing 1 can be guided to some extent to flow downwards. Meanwhile, with the through hole in the lower part of the water shield 5, the water b flowing downwards through the water guide passage a can smoothly flow to the outside of the electric control box 100 through the through hole.

In some embodiments of the present disclosure, the electric control box 100 further includes a water shield 5. The water shield 5 is located outside the housing 1 and covers the opening 12 and the outer water-guiding part 4. A gap c is defined between a lower part of the water shield 5 and an outer surface of the housing 1. Therefore, due to the position of the water shield 5, the water b outside the housing 1 can be to some extent prevented from entering the housing 1 through the opening 12 and hence from affecting the reliability of the electric control box 100, and moreover, the water b outside the housing 1 can be guided to some extent to flow downwards. Meanwhile, with the gap c between the water shield 5 and the housing 1, the water b flowing downwards through the water guide passage a can smoothly flow to the outside of the electric control box 100.

An air conditioner (not shown in the drawings) according to embodiments of the present disclosure includes the above electric control box 100.

The air conditioner according to embodiments of the present disclosure is provided with the electric control box 100 according to the above embodiments of the present disclosure, such that the waterproof effect at the cooling fin 2 is satisfactory, thereby improving the reliability of the air conditioner. Compared with the related art, seal rings and sealants are omitted, such that the electric control box 100 has a simple structure, and materials and installation processes are reduced during the production of the electric control box 100, which further improves the production efficiency of the air conditioner.

The structure of the electric control box 100 according to a specific embodiment of the present disclosure is described in detail hereafter with reference to FIG. 1 to FIG. 4. It should be noted that, the following description is only illustrative, and after those skilled in the art read the following technical solution, it is conceivable that technical solutions and part of technical features can be combined, substituted or modified, which also fall within the protection scope of the present disclosure.

As shown in FIG. 1 to FIG. 4, the electric control box 100 includes the housing 1, the cooling fin 2, the inner water-guiding part 3, the outer water-guiding part 4, the water shield 5, and the circuit board 7.

Specifically, the housing 1 defines the opening 12, and the inner water-guiding part 3 and the outer water-guiding part 4 are located at the opening 12. An upper edge defining the opening 12 is bent towards the outside of the housing 1 to form the water guide plate 11, and the water guide plate 11 is configured as an arc plate protruding towards the cooling fin 2.

The cooling fin 2 runs through the housing 1, and the cooling fin 2 is connected to the housing 1 by means of the threaded fastener 6. A part of the cooling fin 2 is located inside the housing 1, and another part of the cooling fin 2 is located outside the housing 1. The circuit board 7 is fixed to the cooling fin 2 through a screw.

Furthermore, the inner water-guiding part 3 and the outer water-guiding part 4 are integrally formed, and both of the inner water-guiding part 3 and the outer water-guiding part 4 are connected to the housing 1 via butt welding. The inner water-guiding part 3 is located inside the housing 1 and below the cooling fin 2. The outer water-guiding part 4 is located outside the housing 1 and below the inner water-guiding part 3. The inner water-guiding part 3 and the outer water-guiding part 4 define the water guide passage a configured to guide the water b in the housing 1 to the outside of the housing 1. In the direction away from the cooling fin 2, the lower end of the outer water-guiding part 4 inclines towards the direction away from the housing 1. A perpendicular distance between an end of the inner water-guiding part 3 adjacent to the cooling fin 2 and a corresponding position on the housing 1 is L1, and a portion of the cooling fin 2 adjacent to the inner water-guiding part 3 extends into the housing 1 by a length L2, in which $L1 \geq L2$. The water shield 5 is located outside the housing 1 and covers the portion of the water guide passage a outside the housing 1, and a gap c is defined between a lower part of the water shield 5 and an outer surface of the housing 1.

The structure of the electric control box 100 according to another specific embodiment of the present disclosure is described in detail hereafter with reference to FIG. 1, and FIG. 5 to FIG. 7. It should be noted that the following description is illustrative, and after those skilled in the art read the following technical solution, it is conceivable that technical solutions and part of technical features can be combined, substituted or modified, which also fall within the protection scope of the present disclosure.

As shown in FIG. 1, and FIG. 5 to FIG. 7, the electric control box 100 includes the housing 1, the cooling fin 2, the inner water-guiding part 3, the outer water-guiding part 4, the water shield 5, and the circuit board 7.

Specifically, the housing 1 defines the opening 12. A lower edge defining the opening 12 is bent towards the inside of the housing 1 to form the inner water-guiding part 3, and the inner water-guiding part 3 is configured as an arc plate protruding towards a direction away from the cooling fin 2.

The cooling fin 2 runs through the housing 1, and the cooling fin 2 is connected to the housing 1 by means of the threaded fastener 6. A part of the cooling fin 2 is located inside the housing 1 and above the inner water-guiding part 3, and another part of the cooling fin 2 is located outside the housing 1. The circuit board 7 is fixed to the cooling fin 2 through a screw.

The outer water-guiding part 4 is connected to the housing 1 via butt welding. The outer water-guiding part 4 is located outside the housing 1 and below the inner water-guiding part 3. The inner water-guiding part 3 and the outer water-guiding part 4 define the water guide passage a configured to guide the water b in the housing 1 to the outside of the housing 1. In the direction away from the cooling fin 2, the lower end of the outer water-guiding part 4 inclines towards the direction away from the housing 1.

A perpendicular distance between an end of the inner water-guiding part 3 adjacent to the cooling fin 2 and a corresponding position on the housing 1 is L1, and a portion of the cooling fin 2 adjacent to the inner water-guiding part 3 extends into the housing 1 by a length L2, in which $L1 \geq L2$.

The water shield 5 is located outside the housing 1 and covers the opening 12 and the outer water-guiding part 4, and a gap c is defined between a lower part of the water shield 5 and an outer surface of the housing 1.

Other configurations and operations of the electric control box 100 according to the present disclosure are known to those skilled in the art and will not be described in detail.

Reference throughout this specification to "an embodiment," "some embodiments," "an illustrative embodiment", "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples.

Although embodiments of the present disclosure have been shown and described, it would be appreciated by those skilled in the art that changes, alternatives, and modifications can be made in the embodiments without departing from principles and purposes of the present disclosure. The protection scope of the present disclosure is defined by the claims and the equivalent.

What is claimed is:

1. An electric control box for an air conditioner, comprising:
   a housing;

a cooling fin running through the housing, the cooling fin having a part located inside the housing and another part located outside the housing;

an inner water-guiding part extending from the housing a distance into the housing and positioned below the cooling fin;

an outer water-guiding part extending from the housing a distance out of the housing and positioned below the inner water-guiding part, the inner water-guiding part and the outer water-guiding part defining a water guide passage configured to guide water inside the housing to the outside of the housing and wherein the housing defines an opening, and a lower edge defining the opening is bent towards the inside of the housing to form the inner water-guiding part, and a water shield located outside the housing and covering the opening and the outer water-guiding part, the water shield defining a through hole in a lower part thereof.

2. The electric control box according to claim 1, wherein the inner water-guiding part and the outer water-guiding part are located at the opening, and an upper edge defining the opening is bent towards the outside of the housing to form a water guide plate.

3. The electric control box according to claim 2, wherein the water guide plate includes a curved portion.

4. The electric control box according to claim 3, wherein the water guide plate protrudes towards the cooling fin.

5. The electric control box according to claim 1, wherein the inner water-guiding part and the outer water-guiding part are integrally formed.

6. The electric control box according to claim 1, wherein at least one of the inner water-guiding part and the outer water-guiding part is welded to the housing.

7. The electric control box according to claim 1, wherein the inner water-guiding part has a curved portion and is diagonally shaped.

8. The electric control box according to claim 7, wherein the inner water guiding part protrudes towards a direction away from the cooling fin.

9. The electric control box according to claim 1, wherein the outer water-guiding part has a lower end inclining towards a direction away from the housing, in a direction away from the cooling fin.

10. The electric control box according to claim 1, wherein a perpendicular distance between an end of the inner water-guiding part adjacent to the cooling fin and a corresponding position on the housing is L1, and a portion of the cooling fin adjacent to the inner water-guiding part extends into the housing by a length L2, in which L1≥L2.

11. The electric control box according to claim 1, wherein the cooling fin is connected to the housing by means a threaded fastener.

12. An air conditioner, comprising an electric control box according to claim 1.

13. The electric control box according to claim 1, wherein the outer water-guiding part has a lower end inclining towards a direction away from the housing, in a direction away from the cooling fin.

14. The electric control box according to claim 1, wherein a perpendicular distance between an end of the inner water-guiding part adjacent to the cooling fin and a corresponding position on the housing is L1, and a portion of the cooling fin adjacent to the inner water-guiding part extends into the housing by a length L2, in which L1≥L2.

15. The electric control box according to claim 1, wherein the cooling fin is connected to the housing by means a threaded fastener.

16. An air conditioner, comprising an electric control box according to claim 1.

17. An electric control box for an air conditioner, comprising:
a housing;
a cooling fin running through the housing, the cooling fin having a part located inside the housing and another part located outside the housing;
an inner water-guiding part extending from the housing a distance into the housing and positioned below the cooling fin;
an outer water-guiding part extending from the housing a distance out of the housing and positioned below the inner water-guiding part, the inner water-guiding part and the outer water-guiding part defining a water guide passage configured to guide water inside the housing to the outside of the housing, and
a water shield located outside the housing and covering a portion of the water guide passage outside the housing, a gap being defined between a lower part of the water shield and an outer surface of the housing.

18. An electric control box for an air conditioner, comprising:
a housing;
a cooling fin running through the housing, the cooling fin having a part located inside the housing and another part located outside the housing;
an inner water-guiding part extending from the housing a distance into the housing and positioned below the cooling fin;
an outer water-guiding part extending from the housing a distance out of the housing and positioned below the inner water-guiding part, the inner water-guiding part and the outer water-guiding part defining a water guide passage configured to guide water inside the housing to the outside of the housing
and wherein the housing defines an opening, and a lower edge defining the opening is bent towards the inside of the housing to form the inner water-guiding part, and
a water shield located outside the housing and covering a portion of the water guide passage outside the housing, a gap being defined between a lower part of the water shield and an outer surface of the housing.

\* \* \* \* \*